(12) United States Patent
Li et al.

(10) Patent No.: US 9,735,181 B2
(45) Date of Patent: Aug. 15, 2017

(54) ARRAY SUBSTRATE AND METHOD OF MANUFACTURING THE SAME, DISPLAY PANEL, AND DISPLAY DEVICE

(71) Applicants: BOE Technology Group Co., Ltd., Beijing (CN); Beijing BOE Optoelectronics Technology Co., Ltd., Beijing (CN)

(72) Inventors: Tiansheng Li, Beijing (CN); Jing Li, Beijing (CN); Wenyu Zhang, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/238,206

(22) Filed: Aug. 16, 2016

(65) Prior Publication Data
US 2017/0194355 A1    Jul. 6, 2017

(30) Foreign Application Priority Data
Jan. 5, 2016    (CN) .......................... 2016 1 0005362

(51) Int. Cl.
| H01L 27/12 | (2006.01) |
| --- | --- |
| H01L 23/535 | (2006.01) |
| H01L 21/768 | (2006.01) |
| H01L 27/32 | (2006.01) |
| G02F 1/1368 | (2006.01) |
| G02F 1/1335 | (2006.01) |
| G02F 1/1343 | (2006.01) |

(52) U.S. Cl.
CPC ...... *H01L 27/124* (2013.01); *H01L 21/76895* (2013.01); *H01L 23/535* (2013.01); *H01L 27/1259* (2013.01); *H01L 27/3262* (2013.01); *G02F 1/1368* (2013.01); *G02F 1/133514* (2013.01); *G02F 1/134309* (2013.01); *G02F 2201/123* (2013.01)

(58) Field of Classification Search
CPC . H01L 27/124; H01L 27/1259; H01L 23/535; H01L 21/76895; H01L 27/3262; G02F 2201/123; G02F 1/1368; G02F 1/133514; G02F 1/134309
See application file for complete search history.

(56) References Cited

U.S. PATENT DOCUMENTS

| 2001/0019375 A1* | 9/2001 | Kwon .............. G02F 1/136227 349/43 |
| --- | --- | --- |
| 2009/0201455 A1* | 8/2009 | Murai .............. G02F 1/134363 349/139 |

\* cited by examiner

*Primary Examiner* — Roy Potter
*Assistant Examiner* — Paul Patton
(74) *Attorney, Agent, or Firm* — Banner & Witcoff, Ltd.

(57) ABSTRACT

An array substrate and a method of manufacturing the same, a display panel and a display device are disclosed. The array substrate includes: a base substrate, and a first conductive layer, a first insulation layer, a semiconductor layer, a second conductive layer, a second insulation layer, and a third conductive layer that are sequentially formed on the base substrate. The first conductive layer includes a gate electrode pattern, the semiconductor layer includes an active area pattern, and the second conductive layer includes a source-drain electrode pattern; the second insulation layer is provided with a connection via hole between the third conductive layer and the second conductive layer; and the semiconductor layer further includes a spacing pad pattern in a region where the connection via hole is provided.

19 Claims, 7 Drawing Sheets

ARRAY SUBSTRATE AND METHOD OF MANUFACTURING THE SAME, DISPLAY PANEL, AND DISPLAY DEVICE

This application claims priority to and the benefit of Chinese Patent Application No. 201610005362.9, filed on Jan. 5, 2016, which application is incorporated herein in its entirety.

TECHNICAL FIELD

Embodiments of the present disclosure relate to an array substrate and a method of manufacturing the same, a display panel, and a display device.

BACKGROUND

During the production process of a bottom gate type thin film transistor, the etching process of an active layer will typically result in a certain degree of damage to the surface of a gate electrode protection layer (a gate insulation layer) so that the surface of the gate electrode protection layer will become rough and uneven, thereby resulting in coarse crystal grains present in the source-drain metal layer later deposited on the gate electrode protection layer. For the following production processes, if the source-drain metal layer contains coarse crystal grains, then the surface of the source-drain metal layer will become rough, which may lead to problems such as abnormal morphology of the connection portion of the source-drain metal layer in a connection via hole, the disconnection of ITO deposited in the connection via hole, and the susceptibility of corrosion of the source-drain metal layer that is disconnected, which has an adverse influence on the product yield of the display panel.

SUMMARY

An embodiment of the present disclosure provides an array substrate, comprising: a base substrate, and a first conductive layer, a first insulation layer, a semiconductor layer, a second conductive layer, a second insulation layer, and a third conductive layer that are sequentially formed on the base substrate. The first conductive layer comprises a gate electrode pattern, the semiconductor layer comprises an active area pattern, and the second conductive layer comprises a source-drain electrode pattern; the second insulation layer is provided with a connection via hole between the third conductive layer and the second conductive layer; and the semiconductor layer further comprises a spacing pad pattern in a region where the connection via hole is provided.

Another embodiment of the present disclosure provides a method of manufacturing an array substrate, comprising: forming a first conductive layer comprising a gate electrode pattern on a base substrate; forming a first insulation layer on the first conductive layer and the base substrate; forming a semiconductor layer, comprising an active area pattern and a spacing pad pattern, on the first insulation layer; forming a second conductive layer, comprising a source-drain electrode pattern, on the semiconductor layer and the first insulation layer; forming a second insulation layer on the second conductive layer, the semiconductor layer and the first insulation layer; and forming a third conductive layer on the second insulation layer. The second insulation layer is provided with a connection via hole between the third conductive layer and the second conductive layer; and the spacing pad pattern is located in a region where the connection via hole is provided.

Still another embodiment of the present disclosure provides a display panel comprising the above array substrate.

Further still another embodiment of the present disclosure provides a display device, comprising the above display panel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
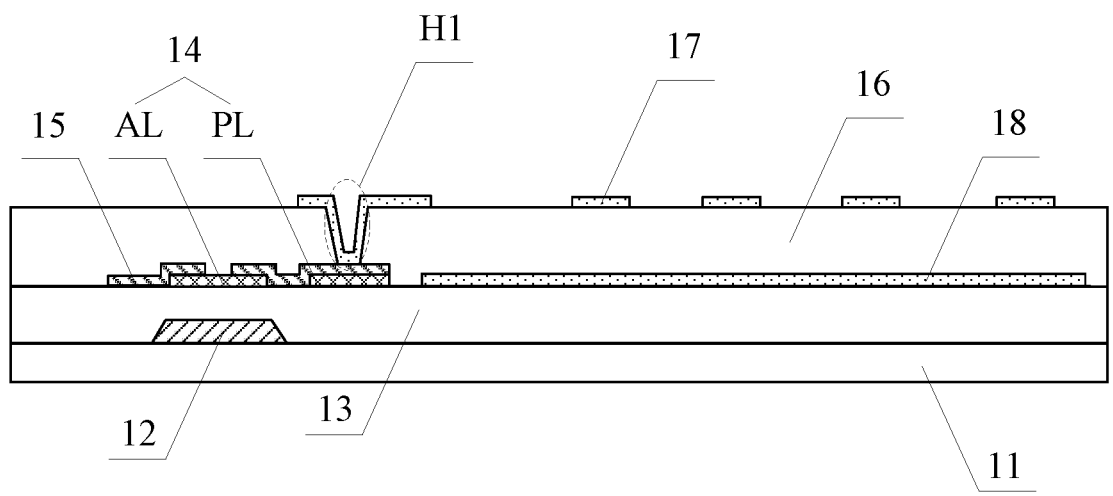
FIG. 1 is a partial cross-sectional schematic view of an array substrate according to an embodiment of the disclosure.
Figure 2:
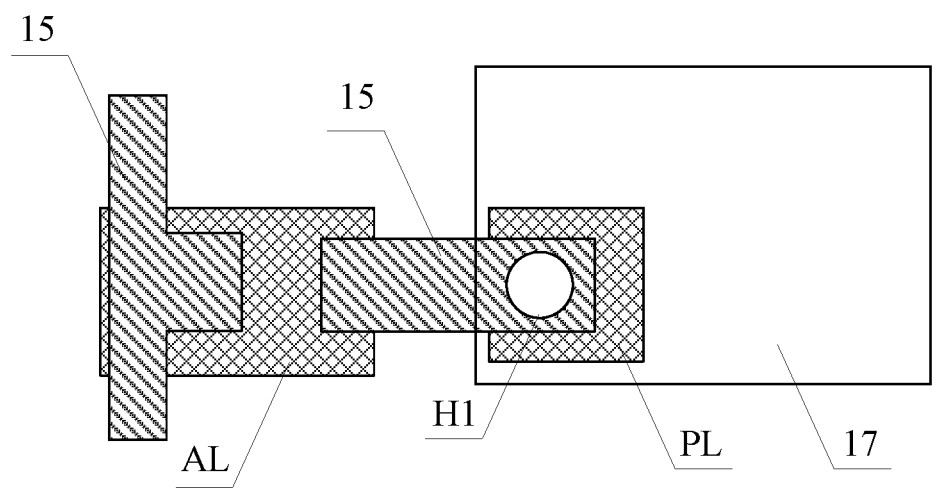
FIG. 2 is a partial schematic plan view of an array substrate as shown in FIG. 1.

FIG. 1 is a partial cross-sectional schematic view of an array substrate according to an embodiment of the disclosure. FIG. 2 is a partial schematic plan view of an array substrate as shown in FIG. 1.

It shall be appreciated that FIG. 1 illustrates the cross-sectional structure of the array substrate within one pixel, and FIG. 2 illustrates the plan view of the structure of the array substrate within one pixel, part of which is hidden.

Referring to FIG. 1 and FIG. 2, the array substrate comprises a base substrate 11, and a first conductive layer 12, a first insulation layer 13, a semiconductor layer 14, a second conductive layer 15, a second insulation layer 16 and a third conductive layer 17 that are sequentially formed on the base substrate 11. The gate electrode pattern in the first conductive layer 12, the active area pattern AL in the semiconductor layer 14, and the source-drain electrode pattern in the second conductive layer 15 together form at least one thin film transistor.

For example, the above base substrate 11, the first insulation layer 13, and the above second insulation layer 16 can be formed by transparent and insulating materials respectively, and each mainly serves to maintain electrical insulation between the structures on both sides thereof. In any region where the gate electrode pattern of the thin film transistor is provided, the source-drain electrode pattern contacts the active area pattern AL Ohm at at least two positions respectively such that a channel region located between the source electrode and the drain electrode of the source-drain electrode pattern can be formed in the active area pattern AL so as to achieve the function of the thin film transistor as a switching element.

Apparently, depending upon the difference in the specific display applications, the array substrate may possess any number of thin film transistors formed by the gate electrode pattern in the first conductive layer 12, the active area pattern AL in the semiconductor layer 14, and the source-drain electrode pattern in the second conductive layer 15 in the same manner as that set forth above, and here no limitation will made in the embodiments of the present disclosure in this aspect.

In addition, in the case where the array substrate illustrated in the figures is used for forming a display device of an IPS (IN-Plane Switching) or ADS (Advanced Super Dimension Switch) type, the third conductive layer 17 and the fourth conductive layer 18 in FIG. 1 can respectively serve as either the pixel electrode or the common electrode for controlling liquid crystal deflection, i.e., the third conductive layer 17 comprises a pixel electrode pattern and the fourth conductive layer 18 comprises a common electrode pattern, or the third conductive layer 17 comprises a common electrode pattern and the fourth conductive layer 18 comprises a pixel electrode pattern. The fourth conductive layer 18 is disposed between the first insulation layer 13 and the second insulation layer 16, and is also formed by a transparent conductive material like the third conductive layer 17. As such, a light-transmitting pixel opening can be provided in the region where the third conductive layer 16 and the fourth conductive layer 18 are provided, which can control liquid crystal deflection in the corresponding region.

However, the third conductive layer 17 illustrated in FIG. 1 and FIG. 2, as a pixel electrode, needs to be connected to the source-drain electrode pattern within each pixel. Therefore, the second insulation layer 16 is provided with a connection via hole H1 between the third conductive layer 17 and the second conductive layer 15, where the third conductive layer 17 can be connected to the source-drain electrode pattern of the second conductive layer 15 through the connection via hole H1 within each pixel. The semiconductor layer 14 may further comprise a spacing pad pattern PL in the region where the connection via hole H1 is provided.

It shall be appreciated that the production process of the array substrate illustrated in FIG. 1 and FIG. 2 may comprise a plurality of patterning processes performed on the base substrate 11. To illustrate the function of the above spacing pad pattern PL, the array substrate provided without any spacing pad pattern PL is used as a reference below to specifically account for the disconnection of the connection via hole resulting from the etching process of the active layer if no spacing pad pattern PL is provided.

Figure 3:
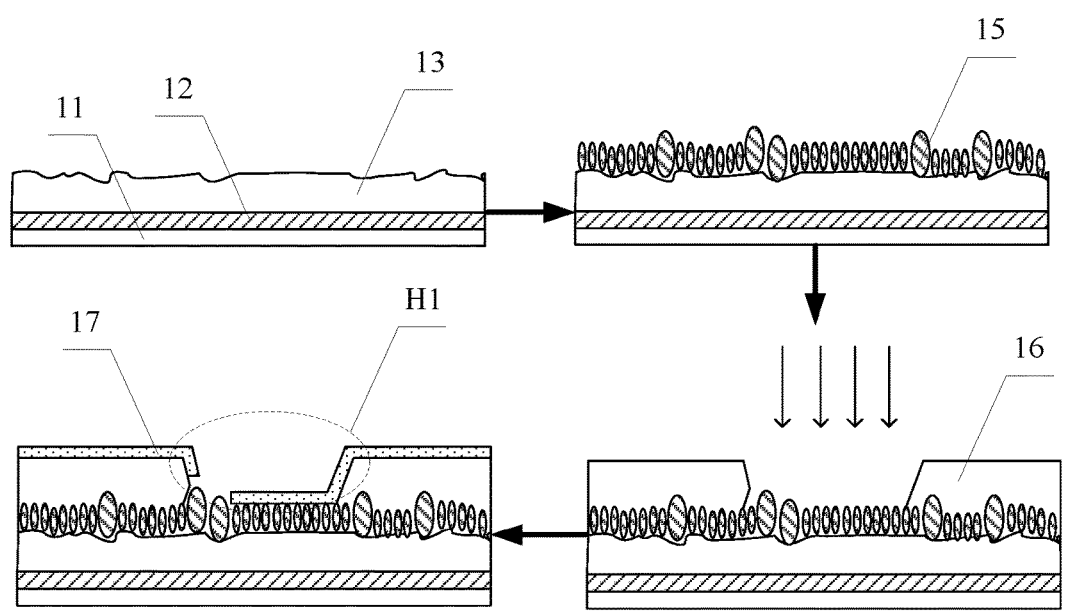
FIG. 3 is a schematic view showing the reason of disconnection of the connection via hole resulting from the etching process of an active layer.

FIG. 3 is a schematic view showing the reason of disconnection in the connection via holes resulting from the etching process of an active layer. Referring to FIG. 3, after forming a first conductive layer 12 and a first insulation layer 13 on a base substrate 11, it is necessary to form for example the above semiconductor layer 14 comprising an active layer pattern AL at the position not shown in FIG. 3, during which process the semiconductor layer needs to be etched. The etching process may cause the upper surface of the first insulation layer 13 to be damaged and thus uneven. Afterwards, during the process of forming a second conductive layer 15 on the first insulation layer 13, for example, during the process of metal deposition, the unevenness of the upper surface of the first insulation layer 13 may cause crystal grains of the second conducive layer 15 as illustrated in the drawing to locally become coarse. The crystal grains of the second conductive layer 15 locally becoming coarse may not affect the evenness of the upper surface of the second insulation layer 16 or the evenness of the inner surface of the connection via hole H1. However, the above appearance of locally coarse crystal grains will result in local break-up of the third conductive layer 17 as illustrated in the figure, for example, in the production process of the third conductive layer 17 which is formed by deposited indium tin oxide (ITO). In the case of severe break-up, effective electrical connection will not be established between the second conductive layer 15 and the third conductive layer 17 within the connection via hole H1, and local disconnection of the circuit will occur, thus leading to poor effects.

In the embodiments of the present disclosure, the semiconductor layer 14 comprises a spacing pad pattern PL provided in a region corresponding to the connection via hole H1, and the surface of the first insulation layer 13 will not be damaged by the etching process of the semiconductor layer 14 under the protection of the spacing pad pattern PL. As such, the second conductive layer 15 formed in the region will not incur local coarse crystal grains. Consequently, the third conductive layer 17 formed in the connection via hole H1 will not involve the disconnection as illustrated in FIG. 3, either.

It can be seen that in the embodiments of the present disclosure, a spacing pad pattern which can separate the first insulation layer from the second conductive layer is provided in the semiconductor layer where the active area pattern of the thin film transistor is located, so that the source-drain metal layer formed on the spacing pad pattern has a better evenness, thereby avoiding abnormal morphology, of the connection portion of the source-drain metal layer in the connection via hole, which results from the etching process of the active layer. A simple adjustment (e.g., adjustment of the mask pattern of the semiconductor layer) can be made for the production process in the embodiments of the present disclosure to significantly increase the yield.

It shall be appreciated that FIG. 1 and FIG. 2 illustrate that the problem of abnormal morphology in the connection via hole is solved by providing a spacing pad pattern merely taking an IPS or ADS display mode as an example. However, the type of the display device to which the array substrate is applicable may not be limited in other embodiments of the present disclosure. For example, the array substrate of an embodiment of the present disclosure may be in a TN mode, under which circumstance the array substrate comprises a pixel electrode, but does not comprise a common electrode which cooperates with the pixel electrode to control liquid crystals. Therefore, in the embodiments of the present disclosure, the array substrate can solve the problem of abnormal morphology in the connection via hole in the respective specific structure as long as it has the above-described at least one thin film transistor, the above connection via hole and the above spacing pad pattern.

Figure 4:
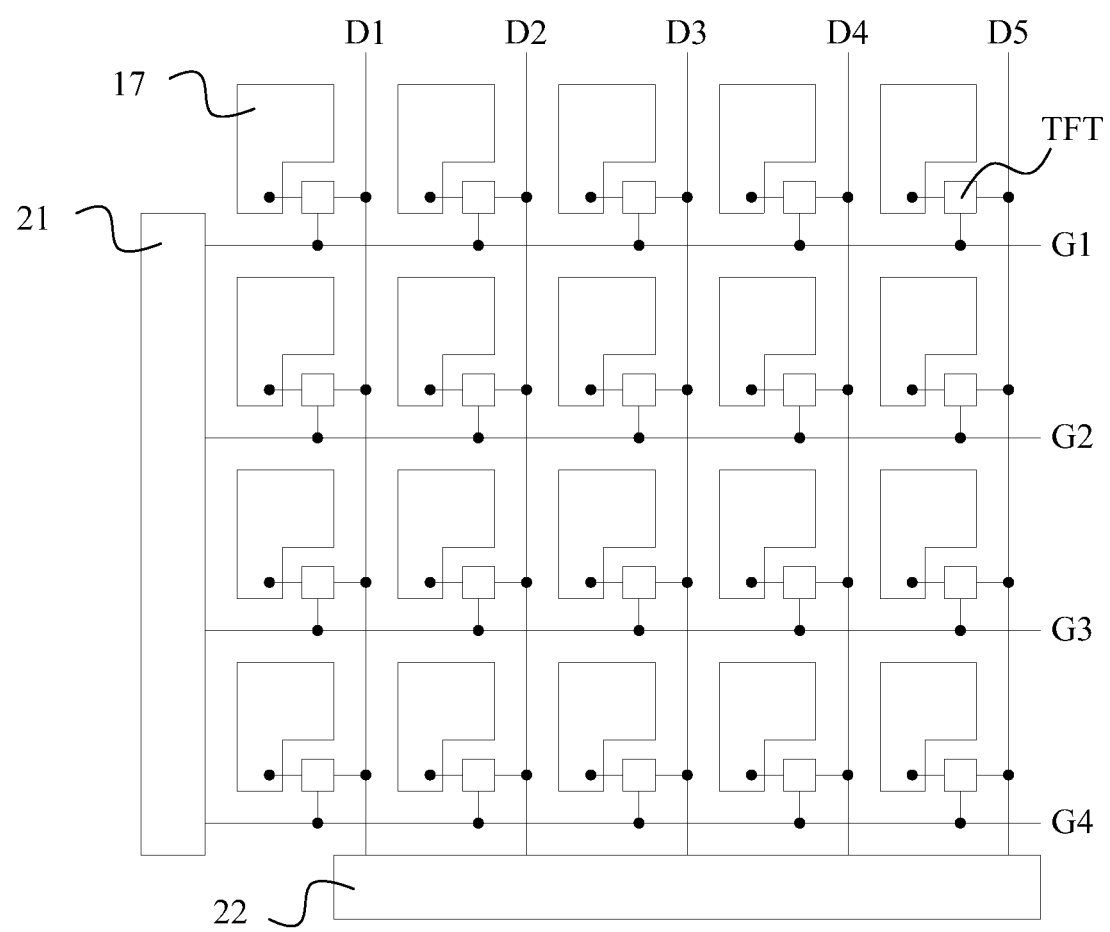
FIG. 4 is a schematic view of the circuit structure on an array substrate according to an embodiment of the disclosure.

FIG. 4 is a schematic view of the circuit structure on an array substrate according to an embodiment of the disclosure, which provides a specific example of the circuit connection relationship of the drive array on an array substrate.

Referring to FIG. 4, the array substrate further comprises a scanning drive circuit 21 which connects a plurality of rows of scanning lines (such as the four rows of scanning lines as shown in G1, G2, G3 and G4), and a data drive circuit 22 which connects a plurality of columns of data lines (such as the five columns of data lines as shown in D1, D2, D3, D4 and D5). As such, the pixels on the array substrate are defined by the rows of scanning lines and the columns of data lines, and the source-drain electrode pattern of the thin film transistor TFT within each pixel respectively connects with the pixel electrode pattern, within the pixel, of the third conductive layer 17 and with a data line, and the gate electrode pattern of the thin film transistor TFT within each pixel connects with a scanning line. During operation, as the scanning drive circuit 21 outputs a gate electrode turn-on signal sequentially to the plurality of rows of scanning lines, the data drive circuit 22 may write corresponding data voltages for the pixel electrodes within pixels through the plurality of columns of data lines to achieve display driving of the array substrate. For example, the above rows of scanning lines may be provided in the above first conductive layer 12 as a scanning line pattern, and the above columns of data lines may be provided in the above third conductive layer 15 as a data line pattern.

Figure 5:
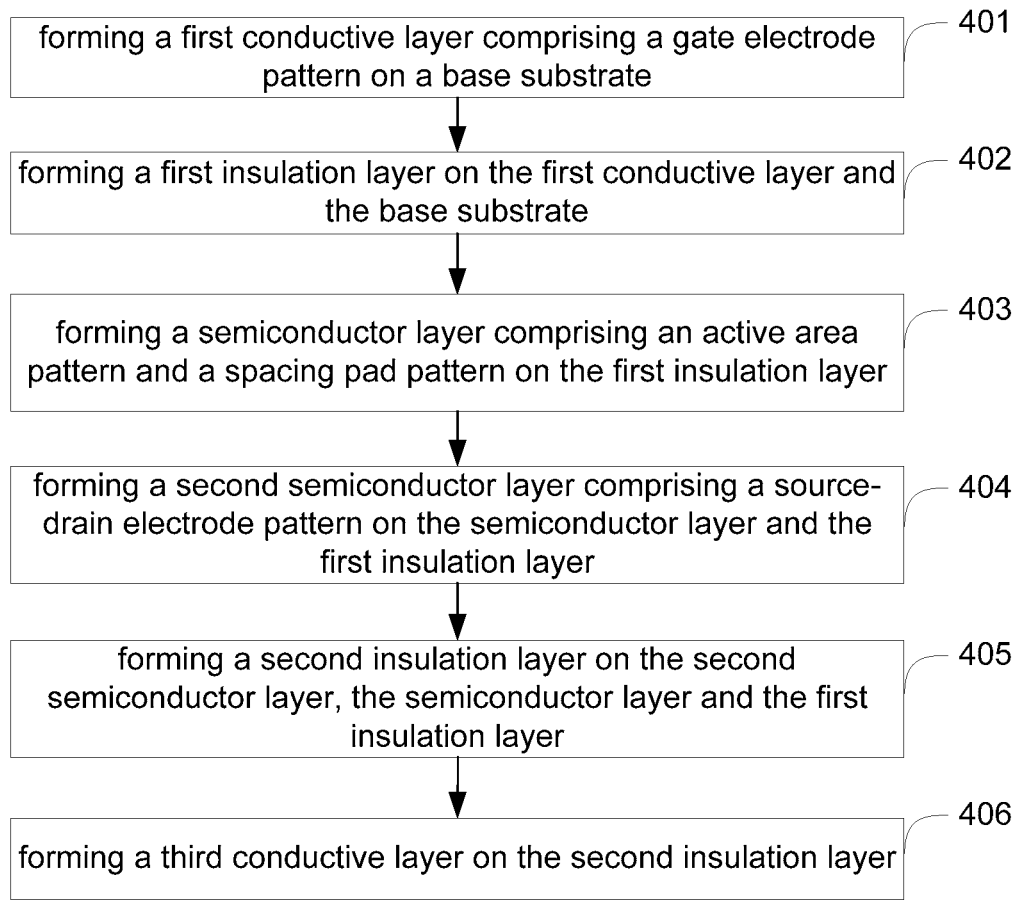
FIG. 5 is a flow chart of the steps of a method of manufacturing an array substrate according to an embodiment of the disclosure.

FIG. 5 is a flow chart of the steps of a method of manufacturing an array substrate according to an embodiment of the disclosure. Referring to FIG. 5, the method of manufacturing comprises the following operation:

Step 501: forming a first conductive layer comprising a gate electrode pattern on a base substrate.

Step 502: forming a first insulation layer on the first conductive layer and the base substrate.

Step 503: forming a semiconductor layer, comprising an active area pattern and a spacing pad pattern on the first insulation layer.

Step 504: forming a second conductive layer, comprising a source-drain electrode pattern on the semiconductor layer and the first insulation layer. One the drain electrode and the source electrode of the source-drain electrode patterns may connect and cover the active area pattern and the spacing pad pattern.

Step 505: forming a second insulation layer on the second conductive layer, the semiconductor layer, and the first insulation layer.

Step 506: forming a third conductive layer on the second insulation layer.

The second insulation layer is provided with a connection via hole between the third conductive layer and the second conductive layer; and the spacing pad pattern is located in the region where the connection via hole is provided and the third conductive layer is led towards one of the drain electrode and the source electrode in the source-drain electrode patterns through the connection via hole and is electrically connected thereto.

The manufacturing method of the embodiments of the present disclosure can be used for the production of any array substrate as described above. For example, FIG. 6 to FIG. 13 are flow charts showing the manufacture of an array substrate according to an embodiment of the disclosure.

Figure 6:
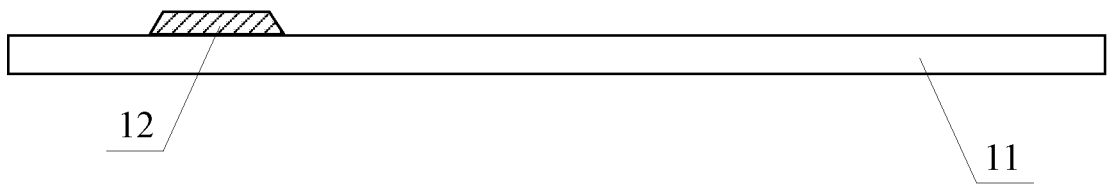
FIG. 6 to FIG. 13 are flow charts showing the manufacture of an array substrate according to an embodiment of the disclosure.

Referring to FIG. 6, the above Step 501 can form a first conductive layer 12 comprising a gate electrode pattern on a base substrate 11 with a conductive material by a patterning process (patterning process of the first time). If the first conductive layer 12 comprises the above scanning line pattern, the scanning line pattern may also be comprised in the pattern formed by a conductive material.

One example of Step 501 may comprise: depositing a metal material layer, forming a photoresist mask layer on the metal material layer, etching the metal material layer with the photoresist mask layer, removing the photoresist mask layer, and the like.

Figure 7:
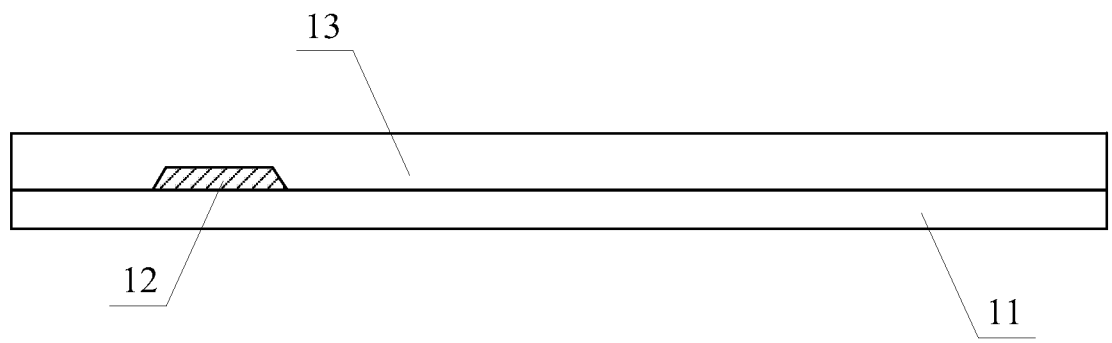

Referring to FIG. 7, the above Step 502 can form a first insulation layer 13 on the first conductive layer 12 with a transparent insulation layer by means of chemical vapor deposition (CVD) or an equivalent manner thereof.

Figure 8:
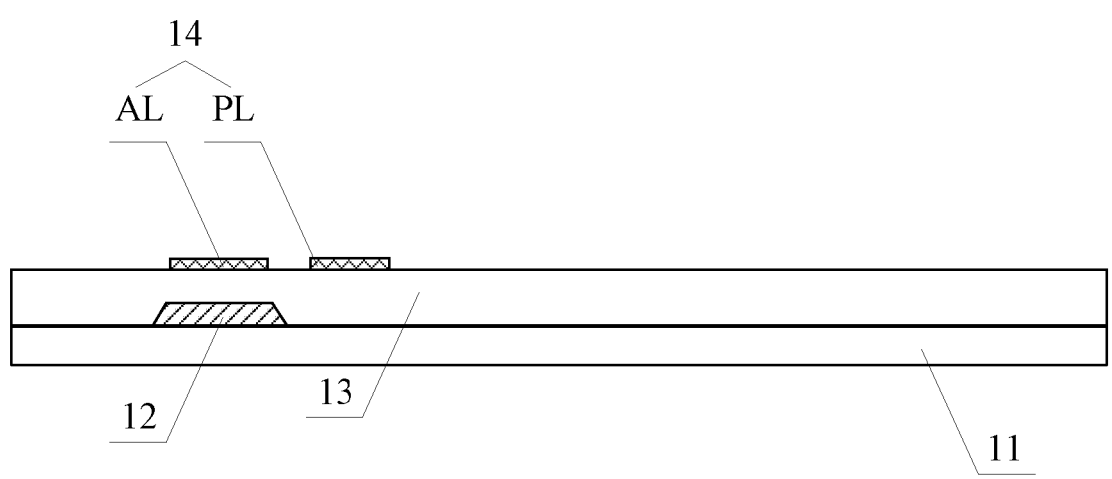

Referring to FIG. 8, the above Step 503 can form a semiconductor layer 14 comprising an active area pattern AL and a spacing pad pattern PL on the first insulation layer 13 with a semiconductor material by means of a patterning process (patterning process of the second time).

One example of Step 503 can comprise: depositing a semiconductor material layer, forming a photoresist mask layer on the semiconductor material layer, etching the semiconductor material layer with the photoresist mask layer, removing the photoresist mask layer, and the like. The etching of the semiconductor material layer may damage the upper surface of the first insulation layer 13.

Figure 9:
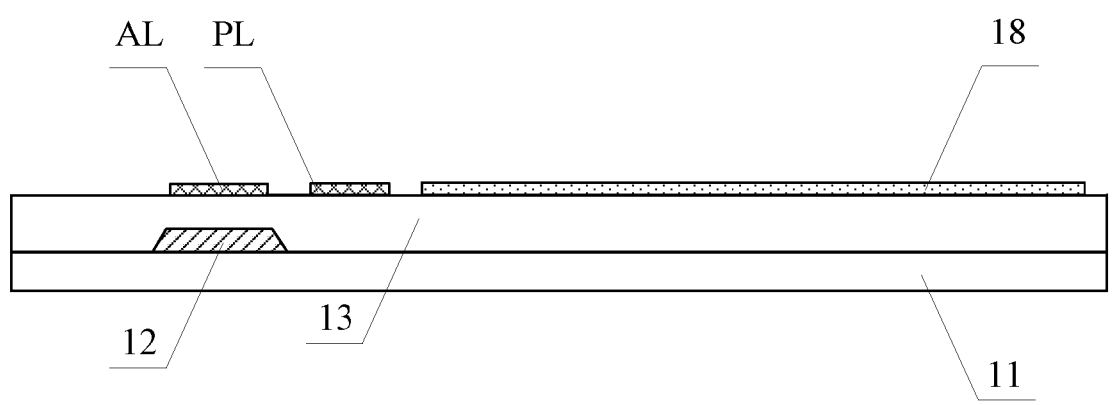

Referring to FIG. 9, a fourth conductive layer 18 can be formed on the first insulation layer 13 with a transparent conductive material by means of a patterning process (patterning process of the third time) between the above Step 503 and Step 504, the fourth conductive layer 18 comprising a common electrode pattern. One example of the step may comprise: depositing the transparent conductive material layer, forming a photoresist mask layer on the transparent conductive material layer, etching the transparent conductive material layer with the photoresist mask layer, removing the photoresist mask layer, and the like. Apparently, the step may also be performed at any time between Step 502 and Step 505, and no limitation will be made by the embodiments of the present disclosure in this aspect.

Figure 10:
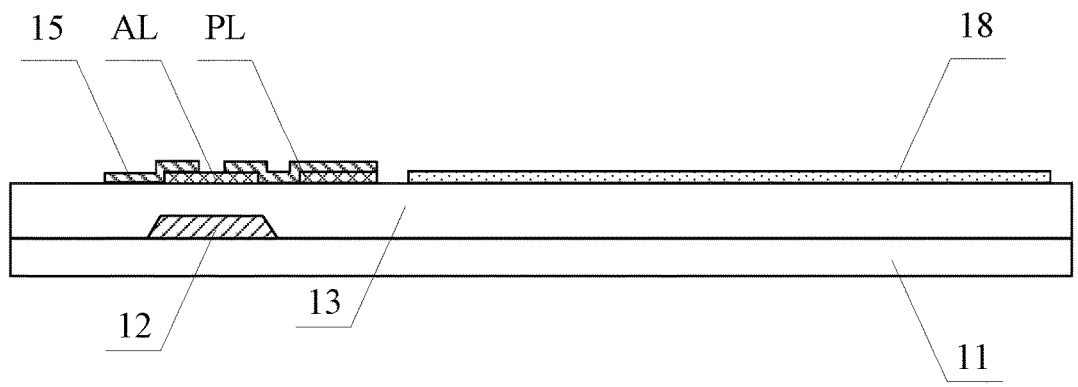

Referring to FIG. 10, the above Step 504 can comprise forming a second conductive layer 15 comprising a source-drain electrode pattern with a conductive material by means of a patterning process (patterning process of the fourth time) on the semiconductor layer 14 and the first insulation layer 13. If the second conductive layer 15 comprises the above data line pattern, the data line pattern can also be comprised in the pattern formed by the conductive material.

One example of Step 504 can comprise: depositing a metal material layer, forming a photoresist mask layer on the metal material layer, etching the metal material layer with the photoresist mask layer, removing the photoresist mask layer, and the like.

Figure 11:
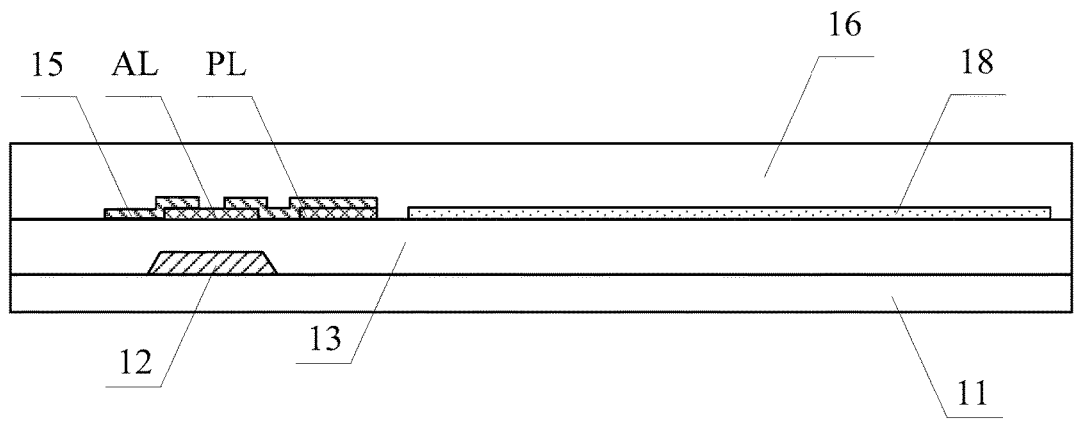

Referring to FIG. 11, the above Step 505 can form a second insulation layer 16 on the second conductive layer 15, the semiconductor layer 14, the first insulation layer 13 and the fourth conductive layer 18 with a transparent insulating material by means of chemical vapor deposition (CVD) or an equivalent manner thereof.

Figure 12:
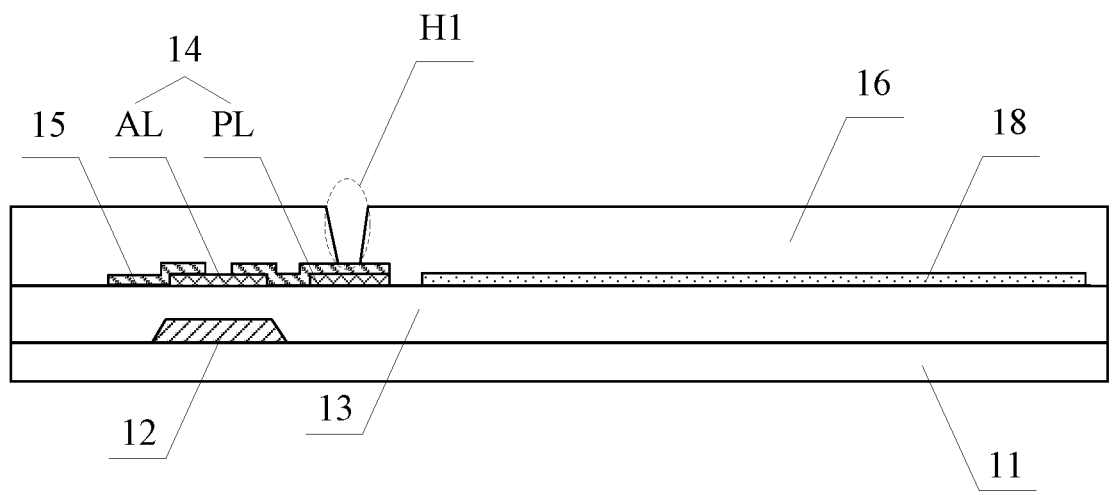

Referring to FIG. 12, because the second insulation layer 16 is provided therein with a connection via hole H1 between the third conductive layer 17 and the second conductive layer 15, and the spacing pad pattern PL is located in the region where the connection via hole H1 is provided, further there may be a step of etching part of the second insulation layer 16 in the region where the connection via hole H1 is provided by means of a patterning process (patterning process of the fifth time), between Step 505 and Step 506, to form the connection via hole H1. It shall be appreciated that the connection position between the third conductive layer 17 and the second conductive layer 15 is generally fixed. Therefore, the position of the spacing pad pattern PL is also set according to the position of the connection via hole H1.

Figure 13:
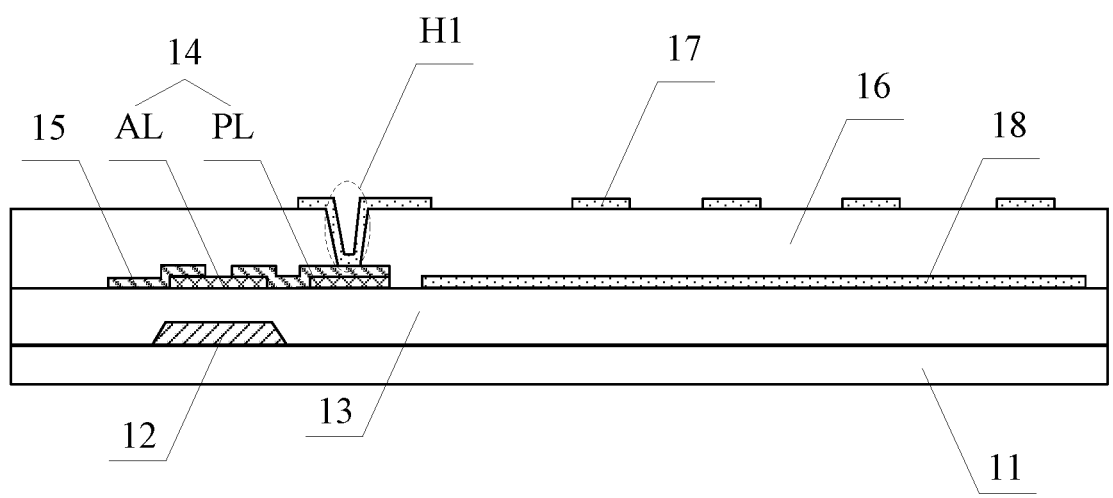

Referring to FIG. 13, the above Step 506 can form a third conductive layer 17 on the second insulation layer 16 with a transparent conductive material by means of a patterning process (patterning process of the sixth time), and the third conductive layer 17 comprises a pixel electrode pattern. It shall be appreciated that one example of the step may comprise depositing a transparent conductive material layer, forming a photoresist mask layer on the transparent conductive material layer, etching the transparent conductive material layer with the photoresist mask layer, removing the photoresist mask layer, and the like.

As such, through the above procedures, the manufacturing method of the embodiments of the present disclosure can result in the structure of the array substrate as illustrated in FIG. 1. Apparently, under the circumstance that the array substrate has other structures, the manufacturing method of the embodiments of the present disclosure can be appropriately adjusted, and no limitation will be made in the present disclosure in this aspect.

Based on the same inventive concept, another embodiment of the present disclosure further provides a display panel, and this display panel comprises for example any one of the above array substrates. It shall be noted that the display panel of the embodiments of the present disclosure can be either of a liquid crystal display panel, an OLED (Organic Light-Emitting Diode) display panel, or an e-ink display panel.

An example of the display panel is a liquid crystal display panel, in which the array substrate and an opposed substrate are disposed opposite to each other so as to form a liquid crystal cell, and a liquid crystal material is filled in the liquid crystal cell. The opposed substrate is, for example, a color filter substrate. A pixel electrode in each pixel unit of the array substrate acts to apply an electric field for controlling the rotation degree of the liquid crystal material, so as to conduct a display operation. In some examples, the liquid crystal display panel further comprises a backlight source used to provide backlight for the array substrate.

Another example of the display panel is an organic light-emitting diode display panel, in which a pixel electrode in each pixel unit of the array substrate functions as an anode or a cathode for driving an organic light emitting material to emit light, so as to conduct a display operation.

Still another example of the display device is an e-ink display device, an e-ink layer is provided on the array substrate, the pixel electrode in each pixel is configured to drive the charged particles to move to conduct a display operation.

It shall be appreciated that the array substrate of the display panel has the above structure comprising a semiconductor layer having a spacing pad pattern, and thus can avoid abnormal morphology in the connection part of the source-drain metal layer, in the connection via hole, resulting from the etching process of an active layer and can significantly increases the yield by simple adjustment to the manufacturing process.

Based on the same inventive concept, the embodiments of the present disclosure provide a display panel comprising any of the above array substrates, which can be any product or component having display function such as a mobile phone, a tablet computer, a TV set, a laptop, a digital photo frame, a navigator or the like. The display device comprises any of the above array substrate, and thus can solve the same technical problem and achieve the same technical effect.

What are described above is related to the illustrative embodiments of the disclosure only and not limitative to the scope of the disclosure; the scopes of the disclosure are defined by the accompanying claims.

The application claims priority to the Chinese patent application No. 201610005362.9, filed on Jan. 5, 2016, the entire disclosure of which is incorporated herein by reference as part of the present application.

What is claimed is:

1. An array substrate, comprising:
   a base substrate, and
   a first conductive layer, a first insulation layer, a semiconductor layer, a second conductive layer, a second insulation layer, and a third conductive layer that are sequentially formed on the base substrate;
   wherein the first conductive layer comprises a gate electrode pattern, the semiconductor layer comprises an active area pattern, and the second conductive layer comprises a source-drain electrode pattern;
   the second insulation layer is provided with a connection via hole between the third conductive layer and the second conductive layer; and
   the semiconductor layer further comprises a spacing pad pattern in a region where the connection via hole is provided, and the spacing pad pattern is separated and spaced apart from the active area pattern.

2. The array substrate according to claim 1, wherein a material for forming the third conductive layer comprises a transparent conductive material.

3. The array substrate according to claim 1, further comprising a fourth conductive layer disposed between the first insulation layer and the second insulation layer, wherein a material for forming the fourth conductive layer comprises a transparent conductive material.

4. The array substrate according to claim 3, wherein the third conductive layer comprises a pixel electrode pattern and the fourth conductive layer comprises a common electrode pattern, or
   the third conductive layer comprises a common electrode pattern and the fourth conductive layer comprises a pixel electrode pattern.

5. The array substrate according to claim 1, wherein the first conductive layer further comprises a scanning line pattern connected to the gate electrode pattern.

6. The array substrate according to claim 1, wherein the third conductive layer further comprises a data line pattern connected to the source-drain electrode pattern.

7. The array substrate according to claim 1, wherein the active area pattern and the spacing pad pattern are connected and covered by at least a portion of the source-drain electrode pattern.

8. The array substrate according to claim 1, wherein the second conductive layer and the third conductive layer are electrically connected to each other through the connection via hole.

9. A method of manufacturing an array substrate, comprising:
   forming a first conductive layer comprising a gate electrode pattern on a base substrate;
   forming a first insulation layer on the first conductive layer and the base substrate;
   forming a semiconductor layer, comprising an active area pattern and a spacing pad pattern, on the first insulation layer;
   forming a second conductive layer, comprising a source-drain electrode pattern, on the semiconductor layer and the first insulation layer;
   forming a second insulation layer on the second conductive layer, the semiconductor layer and the first insulation layer; and
   forming a third conductive layer on the second insulation layer;
   wherein the second insulation layer is provided with a connection via hole between the third conductive layer and the second conductive layer; and the spacing pad pattern is located in a region where the connection via hole is provided, and the spacing pad pattern is separated and spaced apart from the active area pattern.

10. The method of manufacturing an array substrate according to claim 9, wherein a material for forming the third conductive layer comprises a transparent conductive material.

11. The method of manufacturing an array substrate according to claim 9, between forming the semiconductor layer and forming the second insulation layer, further comprising:
   forming a fourth conductive layer on the first insulation layer, wherein a material for forming the fourth conductive layer comprises a transparent conductive material.

12. The method of manufacturing an array substrate according to claim 11, wherein the third conductive layer comprises a pixel electrode pattern and the fourth conductive layer comprises a common electrode pattern, or
   the third conductive layer comprises a common electrode pattern and the fourth conductive layer comprises a pixel electrode pattern.

13. The method of manufacturing an array substrate according to claim 9, wherein the first conductive layer further comprises a scanning line pattern connected to the gate electrode pattern.

14. The method of manufacturing an array substrate according to claim 9, wherein the third conductive layer further comprises a data line pattern connected to the source-drain electrode pattern.

15. The method of manufacturing an array substrate according to claim 9, wherein the active area pattern and the spacing pad pattern are connected and covered by at least a portion of the source-drain electrode pattern.

16. The method of manufacturing an array substrate according to claim 9, wherein the second conductive layer and the third conductive layer are electrically connected to each other through the connection via hole.

17. A display panel, comprising the array substrate according to claim 1.

18. The display panel according to claim 17, wherein the display panel is a liquid crystal display panel, an organic light-emitting diode display panel, or an e-ink display panel.

19. A display device, comprising the display panel according to claim 17.

* * * * *